United States Patent
Nishikawa et al.

(10) Patent No.: US 9,947,574 B2
(45) Date of Patent: Apr. 17, 2018

(54) SEMICONDUCTOR DEVICE

(71) Applicant: KABUSHIKI KAISHA TOSHIBA, Minato-ku, Tokyo (JP)

(72) Inventors: Yukie Nishikawa, Nonoichi Ishikawa (JP); Motoya Kishida, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/855,067

(22) Filed: Sep. 15, 2015

(65) Prior Publication Data

US 2016/0268193 A1 Sep. 15, 2016

(30) Foreign Application Priority Data

Mar. 11, 2015 (JP) .................................. 2015-048890

(51) Int. Cl.
*H01L 27/082* (2006.01)
*H01L 23/48* (2006.01)
(Continued)

(52) U.S. Cl.
CPC .. *H01L 21/76816* (2013.01); *H01L 21/76877* (2013.01); *H01L 23/485* (2013.01);
(Continued)

(58) Field of Classification Search
CPC ......... H01L 21/76816; H01L 21/76877; H01L 23/485; H01L 29/0696; H01L 29/407;
(Continued)

(56) References Cited

U.S. PATENT DOCUMENTS 5,637,924 A 6/1997 Hibino
5,652,158 A 7/1997 Bae
(Continued)

FOREIGN PATENT DOCUMENTS

JP U62-042244 3/1987
JP 05-041455 A 2/1993
(Continued)

OTHER PUBLICATIONS

Korean Office Action dated May 1, 2016 in counterpart Korean patent application No. 10-2015-0107926 along with English translation.

*Primary Examiner* — Su C Kim

(74) *Attorney, Agent, or Firm* — White & Case LLP

(57) ABSTRACT

A semiconductor device according to an embodiment includes a semiconductor layer, a first insulating film provided on the semiconductor layer, a first conductive layer provided on the first insulating film, a second insulating film provided on the semiconductor layer and the first conductive layer, a second conductive layer provided on the second insulating film, a first contact portion connecting the semiconductor layer and the second conductive layer, and a second contact portion connecting the first conductive layer and the second conductive layer. A distance between the semiconductor layer and an upper portion of the second insulating film adjacent to the second contact portion is greater than a distance between the semiconductor layer and an upper portion of the second insulating film adjacent to the first contact portion. The second contact portion has a larger width than the first contact portion.

12 Claims, 10 Drawing Sheets

(51) Int. Cl.
  *H01L 21/768* (2006.01)
  *H01L 29/40* (2006.01)
  *H01L 29/417* (2006.01)
  *H01L 29/739* (2006.01)
  *H01L 29/06* (2006.01)
  *H01L 23/485* (2006.01)
  *H01L 29/45* (2006.01)

(52) U.S. Cl.
  CPC ...... *H01L 29/0619* (2013.01); *H01L 29/0696* (2013.01); *H01L 29/407* (2013.01); *H01L 29/41741* (2013.01); *H01L 29/7397* (2013.01); *H01L 29/456* (2013.01)

(58) Field of Classification Search
  CPC ........... H01L 29/7397; H01L 29/41741; H01L 29/0619; H01L 29/456
  See application file for complete search history.

(56) References Cited

U.S. PATENT DOCUMENTS

| | | | |
|---|---|---|---|
| 5,705,426 A | 1/1998 | Hibino | |
| 5,912,491 A * | 6/1999 | Kobayashi | H01L 29/7802 257/341 |
| 6,245,659 B1 | 6/2001 | Ushiyama | |
| 6,392,272 B1 * | 5/2002 | Hasegawa | H01L 29/66348 257/329 |
| 8,723,254 B2 | 5/2014 | Hikichi | |
| 2009/0212321 A1 | 8/2009 | Hsieh | |
| 2011/0180879 A1 * | 7/2011 | Lee | H01L 21/82384 257/369 |
| 2011/0215474 A1 * | 9/2011 | Liu | H01L 23/532 257/751 |
| 2013/0256783 A1 | 10/2013 | Katou et al. | |
| 2014/0054644 A1 | 2/2014 | Hikasa | |
| 2014/0353770 A1 * | 12/2014 | Kamei | H01L 27/14612 257/408 |

FOREIGN PATENT DOCUMENTS

| | | |
|---|---|---|
| JP | 08-017925 A | 1/1996 |
| JP | 08-227939 A | 9/1996 |
| JP | 2000-188332 A | 7/2000 |
| JP | 2003-218199 A | 7/2003 |
| JP | 2010-098244 A | 4/2010 |
| JP | 2010-135677 A | 6/2010 |
| JP | 2013-211374 A | 10/2013 |
| JP | 2014-060386 A | 4/2014 |
| KR | 10-0124958 B1 | 12/1997 |

* cited by examiner

SEMICONDUCTOR DEVICE

CROSS-REFERENCE TO RELATED APPLICATION

This application is based upon and claims the benefit of priority from Japanese Patent Application No. 2015-048890, filed on Mar. 11, 2015, the entire contents of which are incorporated herein by reference.

FIELD

Embodiments described herein relate generally to semiconductor devices.

BACKGROUND

A semiconductor device includes, for example, a contact portion for electrically connecting a semiconductor layer and a wiring layer or a contact portion for electrically connecting wiring layers. The contact portion is obtained by forming a contact hole. The contact hole is formed by patterning of a photoresist by lithography and by etching of insulating film using the patterned photoresist as a mask.

During the formation of the contact hole, when there is a large step height difference in the surface of the insulating film, it is difficult to form a contact hole in a lower step portion and a contact hole in an upper step portion at the same time. When the sizes of the contact holes are small, it is more difficult to form the contact holes.

It is difficult to form the contact holes because the step height difference in the surface of the insulating film may exceeds a focus margin of a lithography tool. When the step height difference in the surface of the insulating film is greater than the focus margin of the lithography tool, a size of the contact hole may differ from the design values or the contact hole my not be opened.

When the size of the contact hole is not equal to the design values, a contact failure, such as a variation in contact resistance or an increase in contact resistance, occurs. In addition, when the contact hole is not opened, a contact failure, such as the disconnection between wiring lines, occurs. The contact failure causes the degradation of the characteristics of the semiconductor device.

DETAILED DESCRIPTION

Figure 1A:
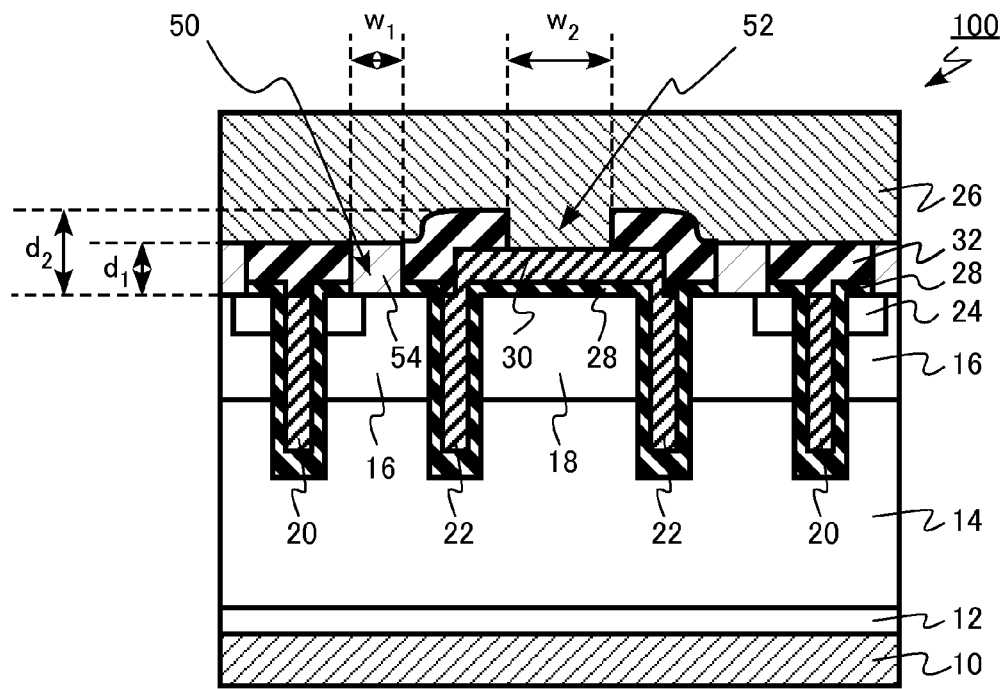
FIGS. 1A and 1B are diagrams schematically illustrating a main portion of a semiconductor device according to a first embodiment.

A semiconductor device according to an embodiment includes a semiconductor layer, a first insulating film provided on the semiconductor layer, a first conductive layer provided on the first insulating film, a second insulating film provided on the semiconductor layer and the first conductive layer, a second conductive layer provided on the second insulating film, a first contact portion connecting the semiconductor layer and the second conductive layer, and a second contact portion connecting the first conductive layer and the second conductive layer. A distance between the semiconductor layer and an upper portion of the second insulating film which is adjacent to the second contact portion is greater than a distance between the semiconductor layer and an upper portion of the second insulating film which is adjacent to the first contact portion. The second contact portion has a larger width than the first contact portion.

Hereinafter, embodiments of the invention will be described with reference to the drawings. In the following description, for example, the same members are denoted by the same reference numerals and the description thereof will not be repeated.

In the specification, the notation of an "$n^+$ type", an "n type", and an "$n^-$ type" means that an n-type impurity concentration is reduced in the order of the $n^+$ type, the n type, and the $n^-$ type. In addition, the notation of a "$p^+$ type", a "p type", and a "$p^-$ type" means that a p-type impurity concentration is reduced in the order of the $p^+$ type, the p type, and the $p^-$ type.

(First Embodiment)

A semiconductor device according to this embodiment includes a semiconductor layer, a first insulating film provided on the semiconductor layer, a first conductive layer provided on the first insulating film, a second insulating film provided on the semiconductor layer and the first conductive layer, a second conductive layer provided on the second insulating film, a first contact portion connecting the semiconductor layer and the second conductive layer, and a second contact portion connecting the first conductive layer and the second conductive layer. A distance between the semiconductor layer and an upper portion of the second insulating film which is adjacent to the second contact portion is greater than a distance between the semiconductor layer and an upper portion of the second insulating film which is adjacent to the first contact portion. The second contact portion has a larger width than the first contact portion.

Figure 1B:
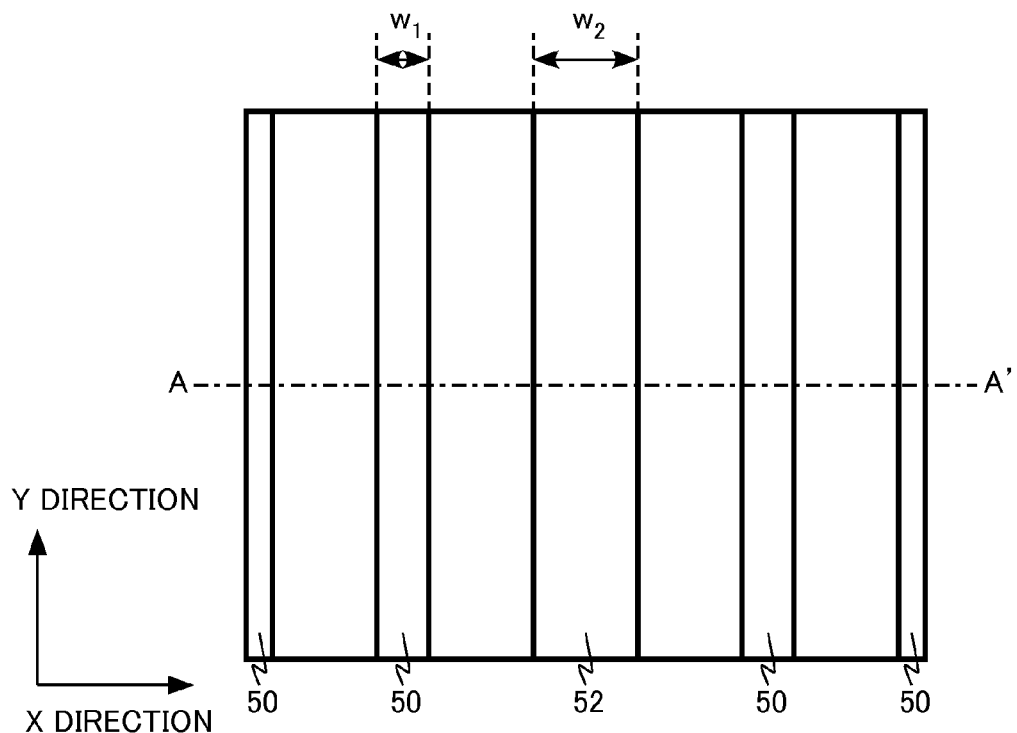

FIGS. 1A and 1B are diagrams schematically illustrating the inside of a cell which is a main portion of the semiconductor device according to this embodiment and in which a trench is formed. FIG. 1A is a cross-sectional view schematically illustrating the main portion and FIG. 1B is a plan view illustrating the pattern of contact portions illustrated in FIG. 1A. FIG. 1A corresponds to a cross section taken along the line AA' of FIG. 1B. For example, a bonding pad for electrically connecting the cell and the outside may be formed in the outer circumference of the cell. For example, a termination portion for ensuring a breakdown voltage may be formed in the outer circumference of the cell.

The semiconductor device according to this embodiment is an insulated gate bipolar transistor (IGBT) having a trench structure. The semiconductor device according to this embodiment is an injection enhanced gate transistor (IEGT) having a structure in which the density of carriers stored in an n-type base in an on state increases on the emitter side.

An IGBT 100 according to this embodiment includes a collector electrode 10, a $p^+$ collector layer 12, an $n^-$ base layer 14, a p-type base layer 16, a p-type floating layer 18, a gate electrode 20, a dummy gate electrode 22, an $n^+$ emitter layer 24, an emitter electrode (second conductive layer) 26, and an insulating film (first insulating film) 28. The p-type base layer 16 and the $n^+$ emitter layer 24 are an example of a semiconductor layer.

In addition, the IGBT 100 includes a dummy gate wiring layer (first conductive layer) 30 and an interlayer insulating film (second insulating film) 32. The IGBT 100 further includes a first contact portion (first opening) 50, a second contact portion (second opening) 52, and a contact plug 54.

The $p^+$ collector layer 12, the $n^-$ base layer 14, the p-type base layer 16, and the p-type floating layer 18 are made of, for example, single-crystal silicon (Si). In each of these layers, p-type impurities are, for example, B (boron) and n-type impurities are, for example, phosphorus (P) or arsenic (As).

The collector electrode 10 has, for example, a stacked structure of metal layers including Al, Ti, Ni, and Au layers. The $p^+$ collector layer 12 is provided on the collector electrode 10.

The $n^-$ base layer 14 is provided on the $p^+$ collector layer 12. The $n^-$ base layer 14 functions as a drift layer of the IGBT 100.

The p-type base layer 16 is provided on the $n^-$ base layer 14. In addition, the p-type floating layer 18 is provided on the $n^-$ base layer 14. The p-type floating layer 18 is electrically insulated from the surroundings.

The IGBT 100 includes the gate electrode 20 which is provided such that the insulating film (first insulating film) 28 is interposed between the gate electrode 20, and the $n^-$ base layer 14 and the p-type base layer 16. In addition, the IGBT 100 includes the dummy gate electrode 22 which is provided such that the insulating film 28 is interposed between the dummy gate electrode 22, and the $n^-$ base layer 14 and the p-type floating layer 18. The insulating film 28 between the gate electrode 20 and the p-type base layer 16 functions as a gate insulating film.

In the IGBT 100, a metal oxide semiconductor field effect transistor (MOSFET) structure in which the $n^+$ emitter layer 24 is a source, the $n^-$ base layer 14 is a drain, the p-type base layer 16 is a base, the insulating film 28 is a gate insulating film, and the gate electrode 20 is gate is formed.

The gate electrode 20 and the dummy gate electrode 22 are made of, for example, polycrystalline silicon including n-type impurities. The insulating film 28 is, for example, a silicon oxide film.

The gate electrode 20 has a function of controlling the formation of a channel in the p-type base layer 16. The dummy gate electrode 22 has a function of preventing a change in the potential of the p-type floating layer 18 from affecting the potential of the gate electrode 20. The dummy gate electrode 22 has the same potential as the emitter electrode 26.

The $n^+$ emitter layer 24 is selectively provided in the surface of the p-type base layer 16. The n-type impurity concentration of the $n^+$ emitter layer 24 is higher than that of the $n^-$ base layer 14.

The dummy gate wiring layer 30 is provided on the insulating film 28 on the p-type floating layer 18. The dummy gate wiring layer 30 is physically and electrically connected to the dummy gate electrode 22. The dummy gate wiring layer 30 supplies the same potential as that of the emitter electrode 26 to the dummy gate electrode 22.

The interlayer insulating film (second insulating film) 32 is provided on the p-type base layer 16, the p-type floating layer 18, the gate electrode 20, the dummy gate electrode 22, and the dummy gate wiring layer 30. The interlayer insulating film 32 is, for example, a silicon oxide film.

The emitter electrode 26 is provided on the interlayer insulating film 32. The first contact portion 50 is provided in the interlayer insulating film 32. The first contact portion 50 is provided in order to connect the p-type base layer (semiconductor layer) 16 and the $n^+$ emitter layer (semiconductor layer) 24 to the emitter electrode (second conductive layer) 26.

The contact plug 54 is provided in the first contact portion 50. The first contact portion 50 is filled with the contact plug 54. The contact plug 54 is made of a material different from that forming the emitter electrode 26.

The contact plug 54 is, for example, metal. The contact plug 54 is, for example, metal including tungsten (W). A barrier metal may be provided between the tungsten, and the p-type base layer 16 and the n⁺ emitter layer 24. The barrier metal is, for example, a stacked film of titanium (Ti) and titanium nitride (TiN).

The second contact portion 52 is provided in the interlayer insulating film 32. The second contact portion 52 is provided in order to connect the dummy gate wiring layer (first conductive layer) 30 to the emitter electrode (second conductive layer) 26. The emitter electrode 26 comes into contact with the dummy gate wiring layer 30 on the side of the second contact portion 52 close to the dummy gate wiring layer 30. A barrier metal may be provided between the dummy gate wiring layer (first conductive layer) 30 and the emitter electrode (second conductive layer) 26. The barrier metal is, for example, a stacked film of titanium (Ti) and titanium nitride (TiN).

The emitter electrode 26 is, for example, a metal electrode. The emitter electrode 26 is made of, for example, metal including aluminum (Al). The emitter electrode 26 may include, for example, a barrier metal. The barrier metal is, for example, a stacked film of titanium (Ti) and titanium nitride (TiN). When the emitter electrode 26 includes the barrier metal, the dummy gate wiring layer (first conductive layer) 30 is contacted with the emitter electrode (second conductive layer) 26 by the barrier metal.

The emitter electrode 26 has, for example, a stacked structure of aluminum (Al) including silicon (Si) and nickel (Ni) or a stacked structure of titanium (Ti), titanium nitride (TiN), aluminum (Al) including silicon (Si), and nickel (Ni).

A distance ($d_1$ in FIG. 1A) from the p-type base layer (semiconductor layer) 16 and the n⁺ emitter layer (semiconductor layer) 24 to an upper portion of the interlayer insulating film (second insulating film) which is adjacent to the first contact portion 50 is less than a distance ($d_2$ in FIG. 1A) from the p-type base layer (semiconductor layer) 16 and the n⁺ emitter layer (semiconductor layer) 24 to an upper portion of the interlayer insulating film (second insulating film) which is adjacent to the second contact portion 52. In other words, a step is formed on the surface of the interlayer insulating film 32. The first contact portion 50 is formed in a lower region of the step and the second contact portion 52 is formed in an upper region of the step.

The step on the surface of the interlayer insulating film 32 is formed due to the dummy gate wiring layer 30. The step on the surface of the interlayer insulating film 32 has a value that is, for example, equal to or greater than 1.0 μm and equal to or less than 2 μm.

The width ($w_1$ in FIGS. 1A and 1B) of the first contact portion (first opening) 50 is less than the width ($w_2$ in FIGS. 1A and 1B) of the second contact portion (second opening) 52. Although the shape of the first contact portion 50 and the second contact portion 52 shown in FIG. 1B is single rectangular shape extending in Y direction, the shape may be a plurality of divided shapes each having square shape, rectangular shape, circular shape or ellipse shape, etc. In the specification, the width of the contact portion (contact hole) means the length of one side when the contact portion has a square shape, the length of a short side when the contact portion has a rectangular shape, a diameter when the contact portion has a circular shape, and the length of the minor axis when the contact portion has an elliptical shape, and the shortest distance between two opposite edges (two sides) when the contact portion has a polygonal shape or an irregular shape.

The width of the contact portion is an index of a focus margin for forming the pattern of contact holes in a lithography process. When the same exposure device (lithography tool) and the same resist process are used, the focus margin tends to increase as the width of the contact hole increases.

In this embodiment, the first contact portion 50 extends in the Y direction. The width ($w_1$) of the first contact portion 50 is a distance between two edges of the first contact portion 50 which are opposite to each other in the X direction. The second contact portion 52 extends in the Y direction. The width ($w_2$) of the second contact portion 52 is a distance between two edges of the second contact portion 52 which are opposite to each other in the X direction.

In this embodiment, the width ($w_1$) of the first contact portion 50 is, for example, equal to or greater than 0.1 μm and equal to or less than 0.8 μm. The width ($w_2$) of the second contact portion 52 is, for example, equal to or greater than 1.0 μm and equal to or less than 10 μm. The width ($w_2$) of the second contact portion 52 is, for example, equal to or greater than five or ten times the width ($w_1$) of the first contact portion 50.

Next, an example of a method for manufacturing the semiconductor device according to this embodiment will be described. FIGS. 2 to 6 are cross-sectional views schematically illustrating the method for manufacturing the semiconductor device according to this embodiment.

Figure 2:
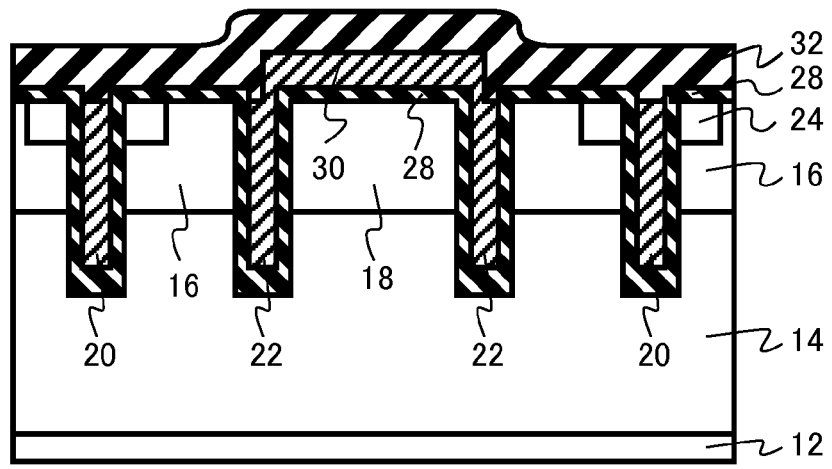
FIG. 2 is a cross-sectional view schematically illustrating the semiconductor device which is being manufactured in a semiconductor device manufacturing method according to the first embodiment.

A Si wafer which has a desired resistivity for the n⁻ base layer 14 is used. First, the p-type base layer (semiconductor layer) 16, the p-type floating layer 18, the gate electrode 20, the dummy gate electrode 22, the n⁺ emitter layer (semiconductor layer) 24, the insulating film (first insulating film) 28, the dummy gate wiring layer (first conductive layer) 30, and the interlayer insulating film (second insulating film) 32 are formed by a known process technique (FIG. 2).

Figure 3:
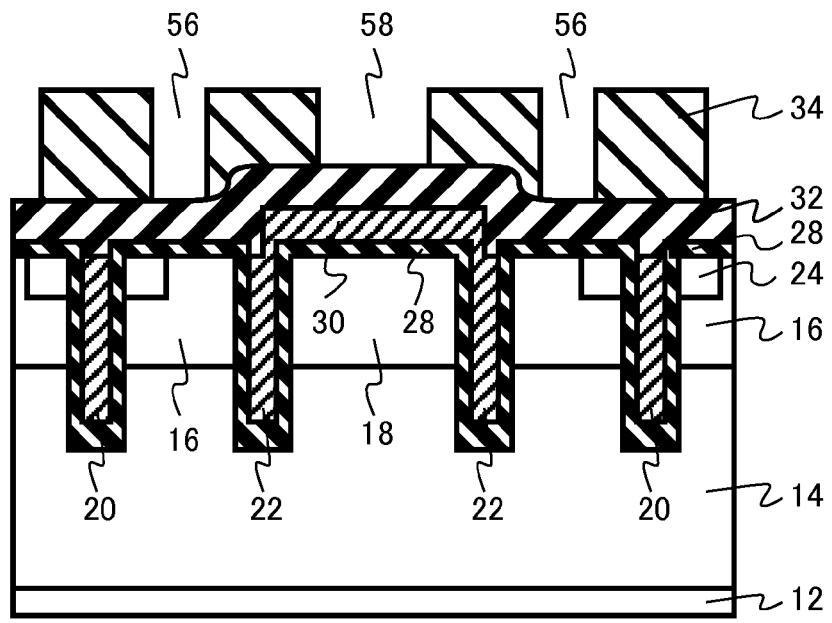
FIG. 3 is a cross-sectional view schematically illustrating the semiconductor device which is being manufactured in the semiconductor device manufacturing method according to the first embodiment.

Then, a photoresist 34 is patterned by a lithography method (FIG. 3). A first pattern 56 for forming the first contact portion and a second pattern 58 for forming the second contact portion are simultaneously formed by this patterning process.

Figure 4:
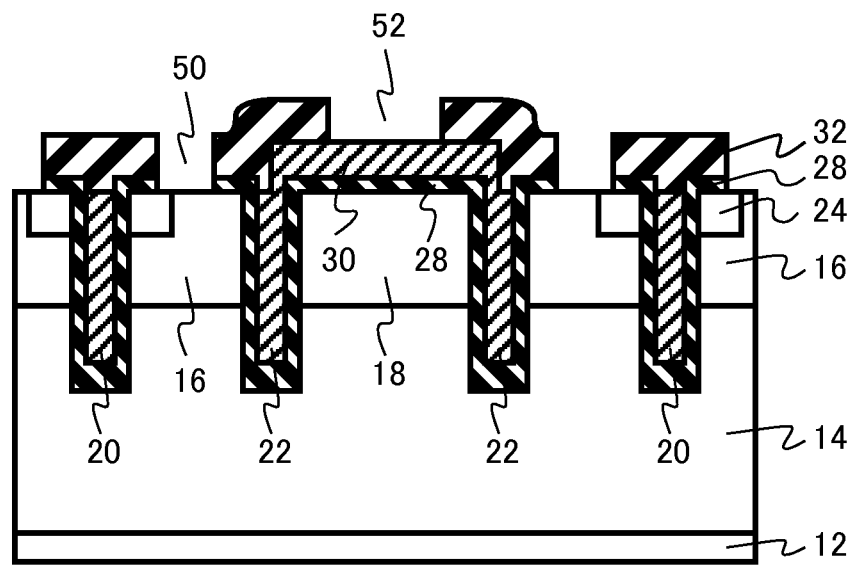
FIG. 4 is a cross-sectional view schematically illustrating the semiconductor device which is being manufactured in the semiconductor device manufacturing method according to the first embodiment.

Then, etching is performed using the photoresist 34 as a mask to form the first contact portion 50 and the second contact portion 52. The etching is performed by, for example, a reactive ion etching (RIE) method. Then, the photoresist 34 is removed (FIG. 4).

Figure 5:
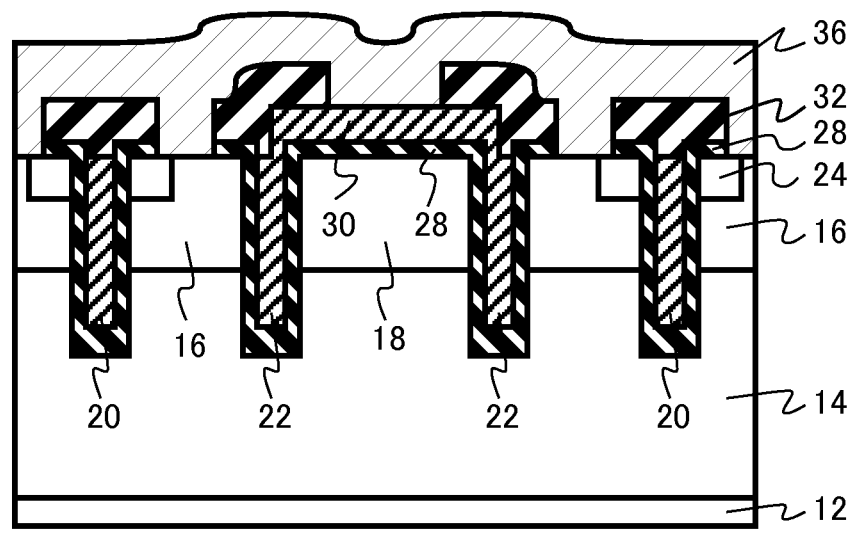
FIG. 5 is a cross-sectional view schematically illustrating the semiconductor device which is being manufactured in the semiconductor device manufacturing method according to the first embodiment.

Then, for example, a titanium film (not illustrated) and a titanium nitride film (not illustrated) are deposited by a sputtering method and a tungsten film 36 is deposited by a chemical vapor deposition (CVD) method (FIG. 5).

Figure 6:
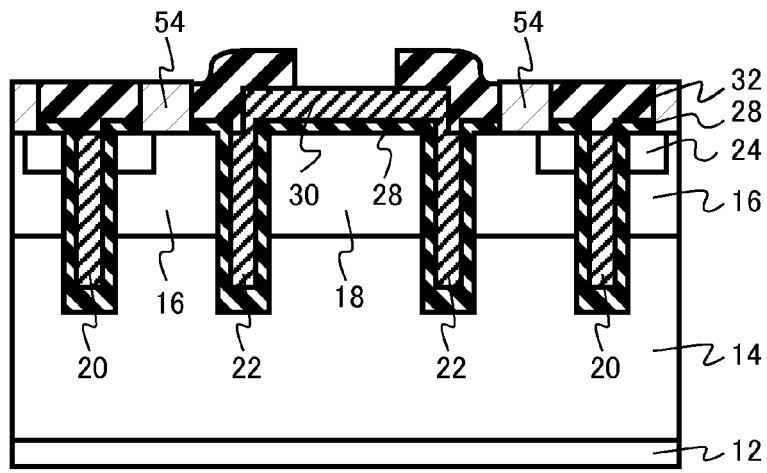
FIG. 6 is a cross-sectional view schematically illustrating the semiconductor device which is being manufactured in the semiconductor device manufacturing method according to the first embodiment.

Then, the tungsten film 36 is etched back to form the contact plug 54 (FIG. 6). The tungsten film 36 is etched back by, for example, isotropic etching and the tungsten film 36 does not remain in the second contact portion 52.

Then, an aluminum film including silicon is deposited on the interlayer insulating film 32 and the contact plug 54 by a sputtering method. Then, a surface passivation film (not illustrated) is formed and a nickel film is deposited on the aluminum film by a plating method. In this way, the emitter electrode 26 is formed.

After the front surface structure is manufactured, the Si wafer is ground to a desired thickness by a known manufacturing method. Then, the p⁺ collector layer 12 is formed on the rear surface and the collector electrode 10 is formed on the surface of the p⁺ collector layer 12 on the rear surface. In this way, the IGBT 100 illustrated in FIG. 1 is manufactured. In this embodiment, an n⁺ base layer may be formed between the p⁺ collector layer 12 and the n⁻ base layer 14, which is not illustrated in the drawings.

Next, the function and effect of the semiconductor device according to this embodiment will be described.

When there is a large level difference (step height difference) in the surface of the interlayer insulating film 32, it is difficult to simultaneously form the first pattern 56 (FIG. 3) for forming the first contact portion 50 which is at a lower part of the step and the second pattern 58 (FIG. 3) for forming the second contact portion 52 which is at an upper part of the step. This is because the value of the step (step height difference) in the surface is greater than the focus margin (focusable range) capable of resolving the first pattern 56 and the second pattern 58 at the same time.

In particularly, when the design rule of the cell is reduced in order to increase the degree of integration of the IGBT 100, the width of the first contact portion 50 of the cell is further reduced. When the width of the first contact portion 50 is further reduced, the focus margin which can resolve the first pattern 56 and the second pattern 58 at the same time is further reduced. Therefore, it is difficult to form the first pattern 56 and the second pattern 58 at the same time.

When a failure occurs in the process of forming the first pattern 56 and the second pattern 58 at the same time, the dimensions of the contact portion may not be equal to the design values or the contact portion may not be opened. When the dimensions of the contact portion are not equal to the design values, a contact failure, such as a variation in contact resistance or an increase in contact resistance, occurs. In addition, when the contact hole is not formed, a contact failure, such as a disconnection between wiring lines, occurs. The contact failure causes degradation of the characteristics of the IGBT 100.

In the IGBT 100, the width ($w_2$) of the second contact portion 52 is greater than the width ($w_1$) of the first contact portion 50. Therefore, the focus margin which can resolve the first pattern 56 and the second pattern 58 at the same time increases. Thus, the dimensional deviation of the contact portion or the non-opening of the contact portion is less likely to occur. As a result, the contact failure of the IGBT 100 is reduced.

The width ($w_2$) of the second contact portion 52 is preferably equal to or greater than five times the width ($w_1$) of the first contact portion 50 and more preferably equal to or greater than ten times the width ($w_1$) of the first contact portion 50 in order to sufficiently ensure the focus margin which can resolve the first pattern 56 and the second pattern 58 at the same time.

(Second Embodiment)

A semiconductor device according to this embodiment is similar to the semiconductor device according to the first embodiment except that it further includes a sidewall which is provided in the second contact portion and is made of the same material as the contact plug. Therefore, in this embodiment, the description of the same components as those in the first embodiment will not be repeated.

Figure 7:
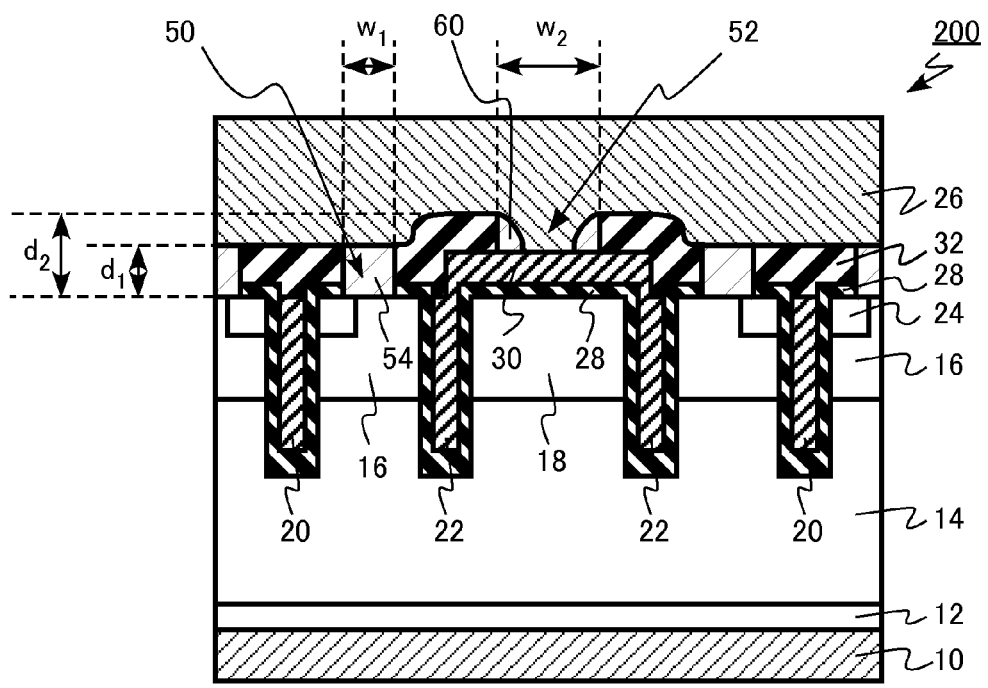
FIG. 7 is a diagram schematically illustrating a main portion of a semiconductor device according to the second embodiment.

FIG. 7 is a diagram schematically illustrating a main portion of the semiconductor device according to this embodiment.

An IGBT 200 according to this embodiment includes a sidewall 60 which is provided in a second contact portion 52. The sidewall 60 is made of the same material as a contact plug 54 in a first contact portion 50. For example, when the contact plug 54 is made of tungsten, the sidewall 60 is also made of tungsten.

Figure 8:
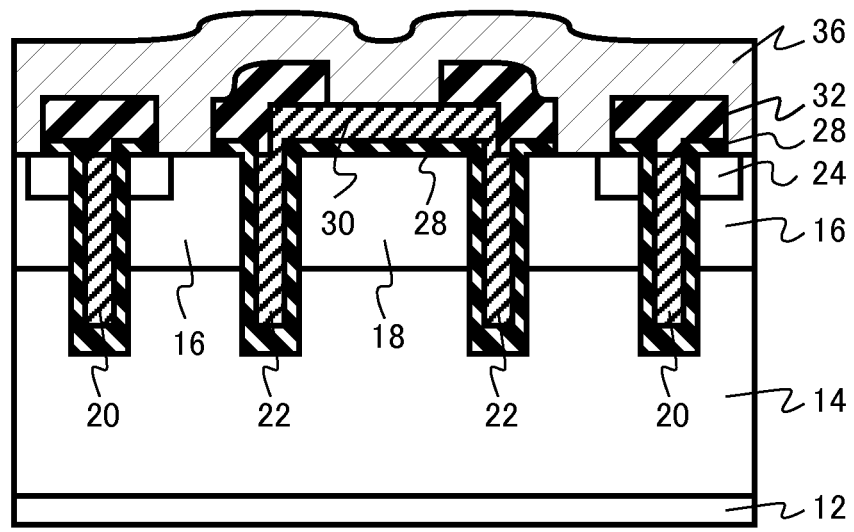
FIG. 8 is a cross-sectional view schematically illustrating the semiconductor device which is being manufactured in a semiconductor device manufacturing method according to a second embodiment.
Figure 9:
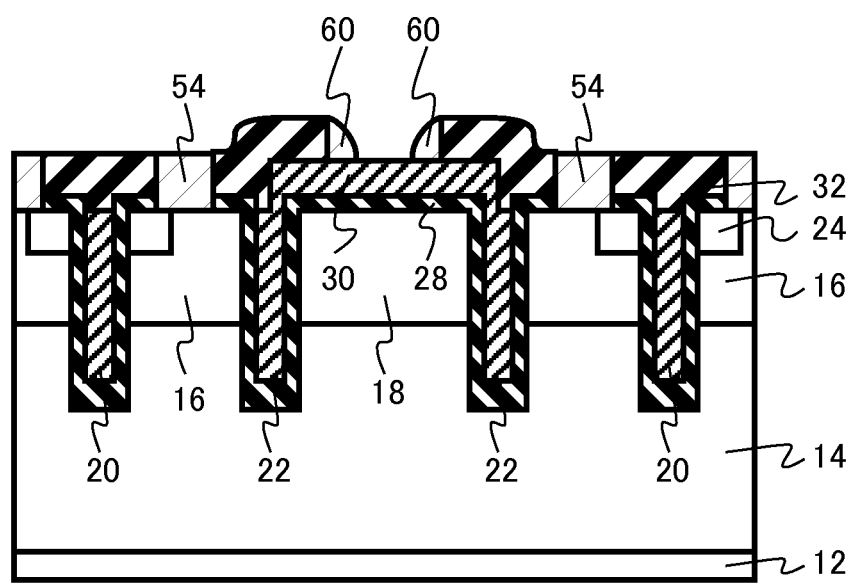
FIG. 9 is a cross-sectional view schematically illustrating the semiconductor device which is being manufactured in the semiconductor device manufacturing method according to the second embodiment.

Next, an example of a method for manufacturing the semiconductor device according to this embodiment will be described. FIGS. 8 and 9 are cross-sectional views schematically illustrating the method for manufacturing the semiconductor device according to this embodiment.

The first contact portion 50 and the second contact portion 52 are formed. For example, a titanium film (not illustrated) and a titanium nitride film (not illustrated) are deposited by a sputtering method. Then, a tungsten film 36 is deposited by a CVD method. This process is the same as that in the manufacturing method according to the first embodiment (FIG. 8).

Then, the tungsten film 36 is etched back to form the contact plug 54. At the same time, the sidewall 60 is formed in the second contact portion 52 (FIG. 9). The tungsten film 36 is etched back by, for example, an RIE method with strong anisotropy and the tungsten film 36 remains as the sidewall 60 in the second contact portion 52.

Then, an aluminum film including silicon is deposited on an interlayer insulating film 32 and the contact plug 54 by a sputtering method. Then, a surface passivation film (not illustrated) is formed and a nickel film is deposited on the aluminum film by a plating method. In this way, an emitter electrode 26 is formed.

After the front surface structure is manufactured, the Si wafer is ground to a desired thickness by a known manufacturing method. Then, a $p^+$ collector layer 12 is formed on the rear surface and a collector electrode 10 is formed on the surface of the $p^+$ collector layer 12 on the rear surface. In this way, the IGBT 200 illustrated in FIG. 7 is manufactured.

Next, the function and effect of the semiconductor device according to this embodiment will be described.

In the IGBT 200 according to this embodiment, similarly to the first embodiment, the width ($w_2$) of the second contact portion 52 is greater than the width ($w_1$) of the first contact portion 50. Therefore, a contact failure is reduced, similarly to the first embodiment.

In a contact having a relatively large opening portion, such as the second contact portion 52, in some cases, a failure occurs in a thermal cycle test (TCT) or a power cycle test (PCT). This is because there is a large difference between the linear expansion coefficients of silicon in the semiconductor layer and metal (for example, aluminum) in the emitter electrode. A significantly large amount of stress is applied to a contact with a large opening portion with a large contact area with metal due to the difference between the linear expansion coefficients.

Specifically, for example, it is assumed that the dummy gate wiring layer (first conductive layer) 30 is made of polycrystalline silicon and the emitter electrode (second conductive layer) 26 is made of metal having aluminum as a main component. Polycrystalline silicon and single-crystal silicon have substantially the same linear expansion coefficient. In this case, during the thermal cycle test or the power cycle test, strong stress is applied to the emitter electrode (second conductive layer) 26 in the horizontal direction due to the difference between the linear expansion coefficients of silicon and polycrystalline silicon, and aluminum. In particularly, since the contact with a large opening portion is provided, strong stress is applied in the horizontal direction. As a result, a so-called Al slide phenomenon occurs due to the stress applied to the emitter electrode 26 and, for example, a crack occurs in aluminum, which results in the opening or short circuit of a wiring line. Therefore, the failure which occurs in the thermal cycle test or the power cycle test causes a degradation in the reliability of a product.

In the IGBT 200, the sidewall 60 is provided in the second contact portion 52. The material forming the sidewall 60 differs from the material forming the emitter electrode 26.

Since a so-called anchor effect occurs between the surface of the sidewall 60 and the emitter electrode 26, the adhesion between the surface of the sidewall 60 and the emitter electrode 26 increases. Therefore, the adhesion between the emitter electrode (second conductive layer) 26 and the under lying layers is improved and it is possible to prevent the Al slide phenomenon in the contact portion. As a result, the failure rate of the thermal cycle test or the power cycle test is reduced. Therefore, the IGBT 200 with high reliability is achieved.

It is considered that fine uneven portions are generated in the surface of the sidewall 60 by etching during the formation of the sidewall 60 and the surface area of the sidewall 60 substantially increases, which causes the anchor effect between the surface of the sidewall 60 and the emitter electrode 26.

(First Modification)

Figure 10:
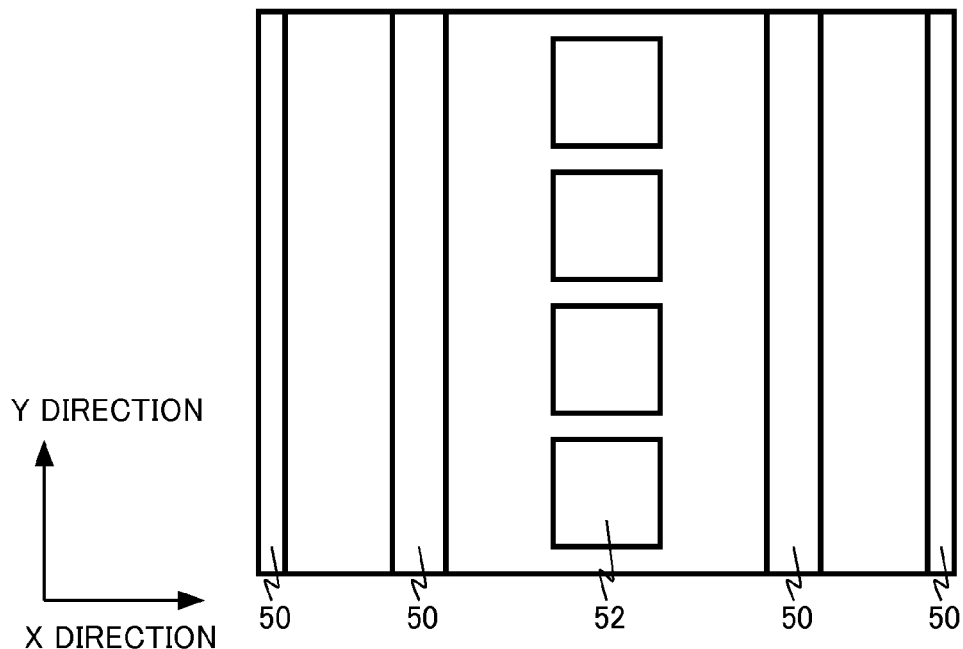
FIG. 10 is a plan view illustrating the pattern of contact portions according to a first modification of the second embodiment.

FIG. 10 is a plan view illustrating the pattern of contact portions in cells according to a first modification of this embodiment. In this modification, a plurality of second contact portions 52 are provided so as to be adjacent to each other in the Y direction.

According to this modification, the perimeter of the second contact portions 52 is greater than, for example, that of the second contact portion 52 illustrated in FIG. 1B. As a result, the contact area between the surface of the sidewall 60 and the emitter electrode 26 increases. The adhesion between the emitter electrode 26 and the under lying layers is further improved. Therefore, the IGBT 200 with high reliability is achieved.

(Second Modification)

Figure 11:
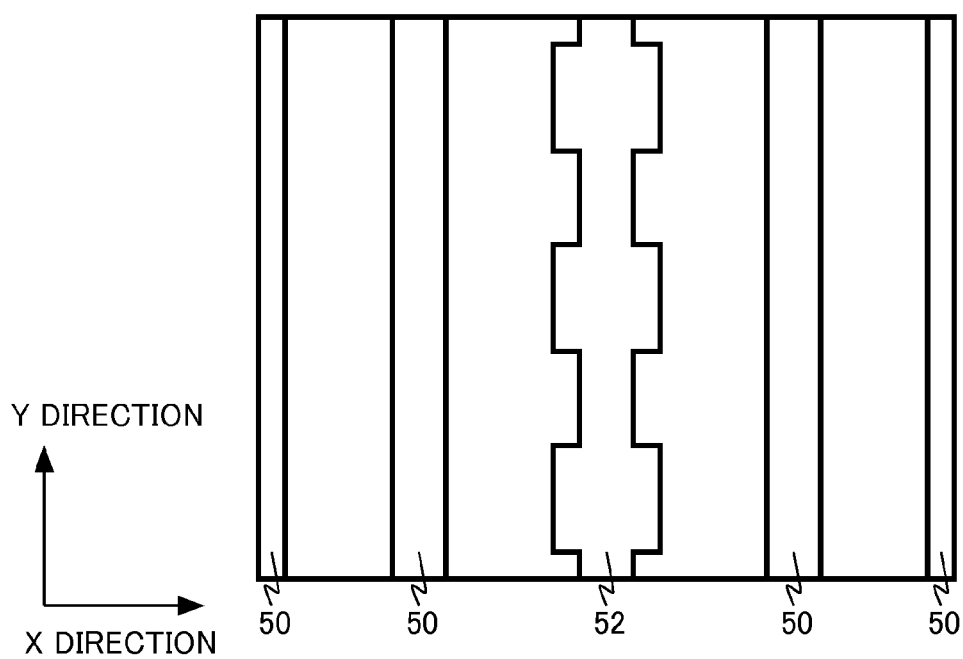
FIG. 11 is a plan view illustrating the pattern of contact portions according to a second modification of the second embodiment.

FIG. 11 is a plan view illustrating the pattern of contact portions according to a second modification of this embodiment. In this modification, the edge of a second contact portion 52 has an uneven shape in the plane (XY plane) parallel to the surface of the semiconductor layer.

According to this modification, the perimeter of the second contact portion 52 is greater than, for example, that of the second contact portion 52 illustrated in FIG. 1B. As a result, the contact area between the surface of the sidewall 60 and the emitter electrode 26 increases. The adhesion between the emitter electrode 26 and the under lying layers is further improved. Therefore, the IGBT 200 with high reliability is achieved.

(Third Modification)

Figure 12:
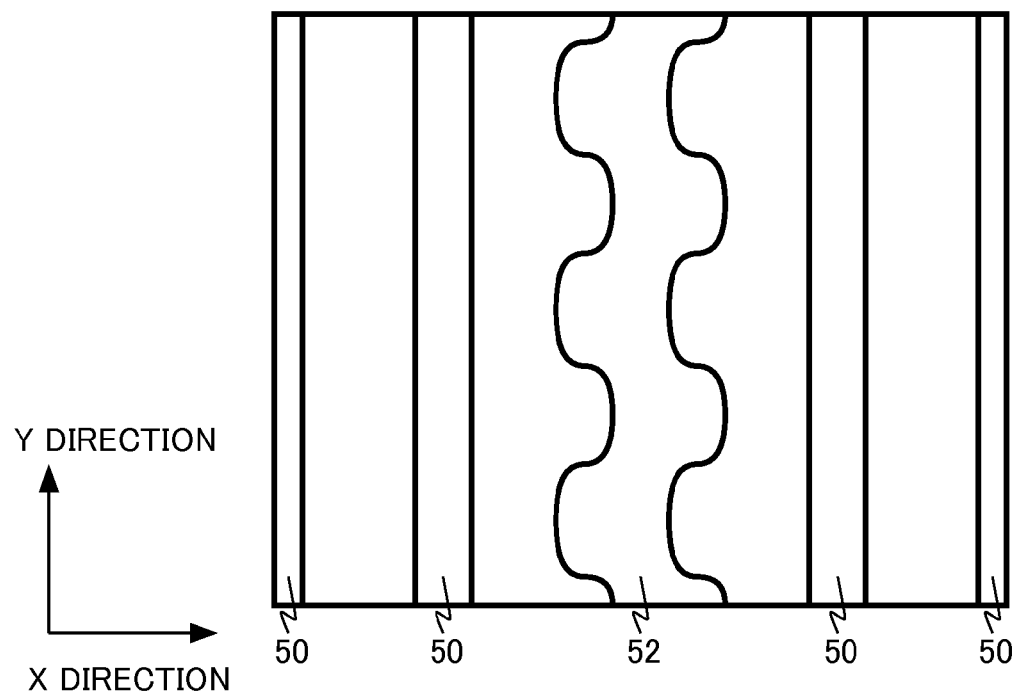
FIG. 12 is a plan view illustrating the pattern of contact portions according to a third modification of the second embodiment.

FIG. 12 is a plan view illustrating the pattern of contact portions according to a third modification of this embodiment. In this modification, the edge of a second contact portion 52 has a wavy shape in the plane (XY plane) parallel to the surface of the semiconductor layer.

According to this modification, the perimeter of the second contact portion 52 is greater than, for example, that of the second contact portion 52 illustrated in FIG. 1B. As a result, the contact area between the surface of the sidewall 60 and the emitter electrode 26 increases. The adhesion between the emitter electrode 26 and the under lying layers is further improved. Therefore, the IGBT 200 with high reliability is achieved.

According to this embodiment, similarly to the first embodiment, the contact failure of the IGBT 200 is reduced. In addition, since the sidewall 60 is provided, the degradation of the reliability of the IGBT 200 is reduced. According to the modification of this embodiment, the perimeter of the second contact portion 52 increases and the degradation of the reliability of the IGBT 200 is reduced.

(Third Embodiment)

A semiconductor device according to this embodiment differs from the semiconductor device according to the second embodiment in that it includes a second conductive layer and a third conductive layer which are physically independent. Hereinafter, the description of the same components as those in the second embodiment will not be repeated.

Figure 13:
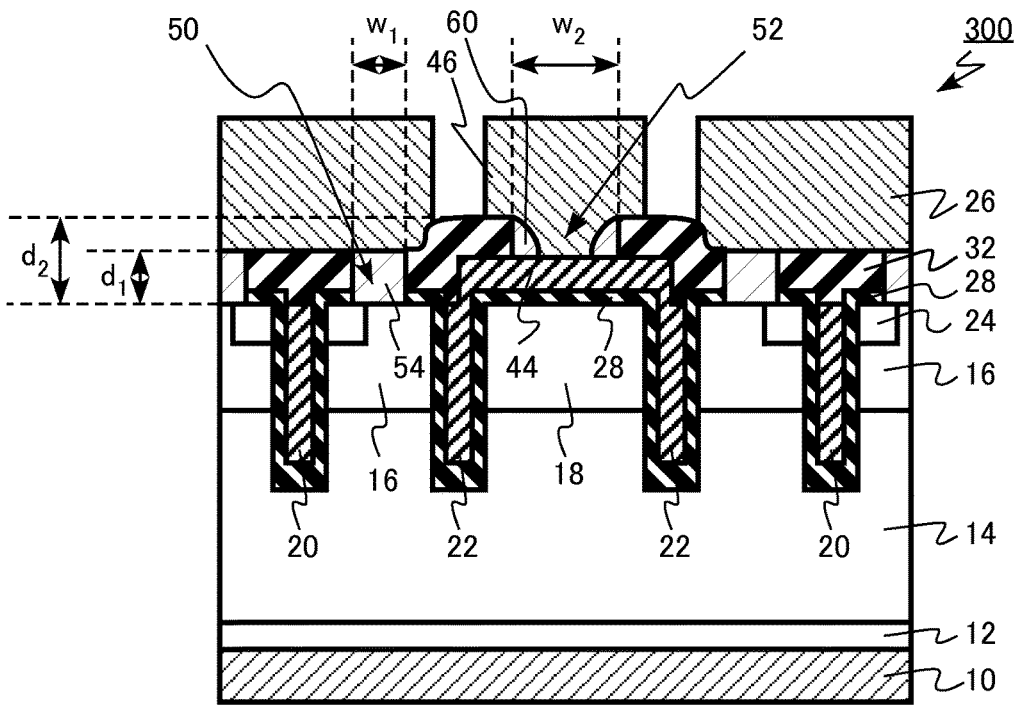
FIG. 13 is a diagram schematically illustrating a main portion of a semiconductor device according to a third embodiment.

FIG. 13 is a diagram schematically illustrating a main portion of the semiconductor device according to this embodiment.

An IGBT 300 according to this embodiment includes a gate wiring layer (first conductive layer) 44, instead of the dummy gate wiring layer 30 according to the second embodiment. In addition, the IGBT 300 includes an emitter electrode (second conductive layer) 26 and a gate wiring electrode (third conductive layer) 46 which are provided on an interlayer insulating film (second insulating film) 32.

A first contact portion 50 is provided in order to connect a p-type base layer (semiconductor layer) 16 and an n$^+$ emitter layer (semiconductor layer) 24 to the emitter electrode (second conductive layer) 26. A second contact portion 52 is provided in order to connect the gate wiring layer (first conductive layer) 44 to the gate wiring electrode (third conductive layer) 46. The gate wiring layer 44 is physically and electrically independent of the dummy gate electrode 22. For example, the same potential as that of a gate electrode 20 is applied to the gate wiring layer 44.

According to this embodiment, similarly to the second embodiment, since a sidewall 60 is provided, the degradation of the reliability of the IGBT 300 is reduced.

(Fourth Embodiment)

A semiconductor device according to this embodiment is similar to the semiconductor device according to the second embodiment except that a distance between a semiconductor layer and an upper portion of an interlayer insulating film (second insulating film) which is adjacent to a first contact portion is substantially equal to a distance between the semiconductor layer and an upper portion of the interlayer insulating film (second insulating film) which is adjacent to a second contact portion. Therefore, the description of the same components as those in the second embodiment will not be repeated.

Figure 14:
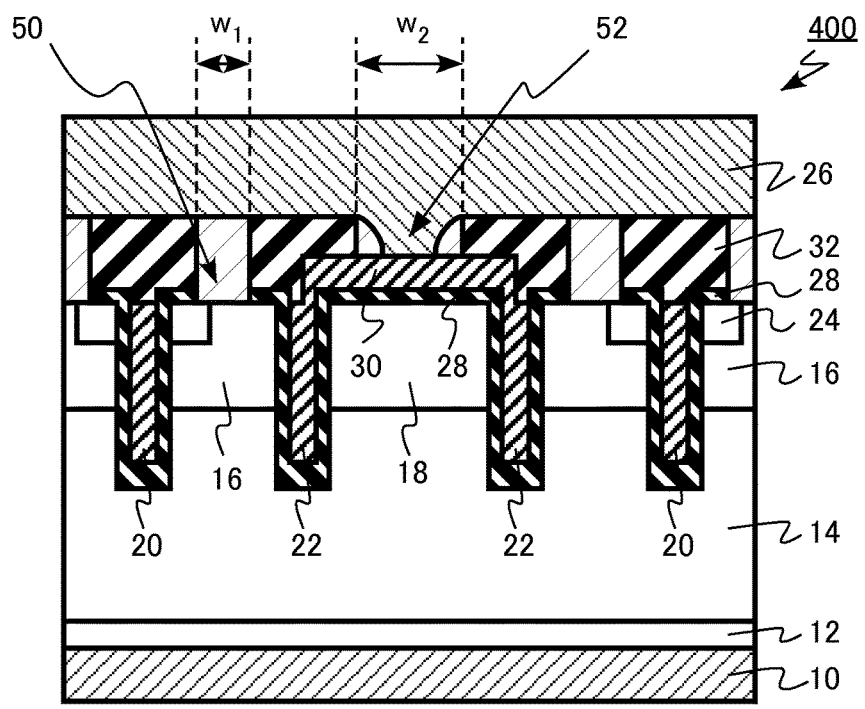
FIG. 14 is a diagram schematically illustrating a main portion of a semiconductor device according to a fourth embodiment.

FIG. 14 is a diagram schematically illustrating a main portion of the semiconductor device according to this embodiment.

In an IGBT 400 according to this embodiment, a distance between a p-type base layer (semiconductor layer) 16 and an n$^+$ emitter layer (semiconductor layer) 24, and an upper portion of an interlayer insulating film (second insulating film) 32 which is adjacent to a first contact portion 50 is substantially equal to a distance between the p-type base layer (semiconductor layer) 16 and the n$^+$ emitter layer (semiconductor layer) 24, and an upper portion of the interlayer insulating film (second insulating film) 32 which is adjacent to a second contact portion 52. In other words, there is no level difference in the surface of the interlayer insulating film 32 and the surface of the interlayer insulating film 32 is flat.

Figure 15:
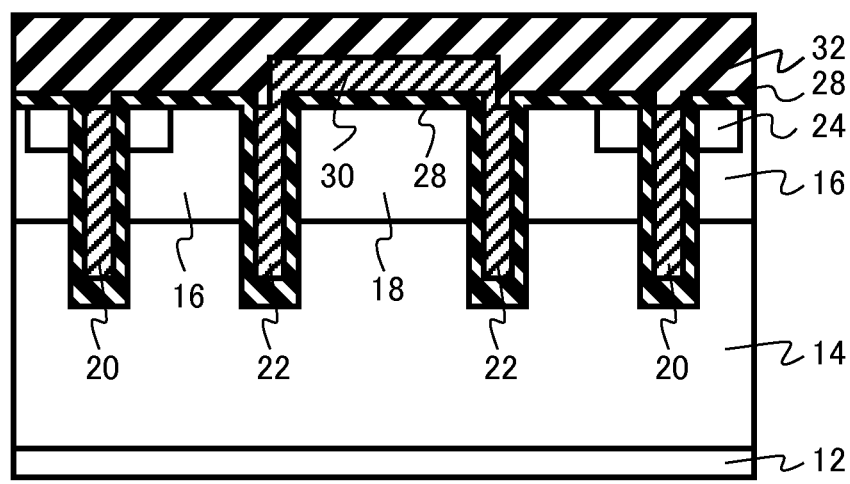
FIG. 15 is a cross-sectional view schematically illustrating the semiconductor device which is being manufactured in a semiconductor device manufacturing method according to the fourth embodiment.
Figure 16:
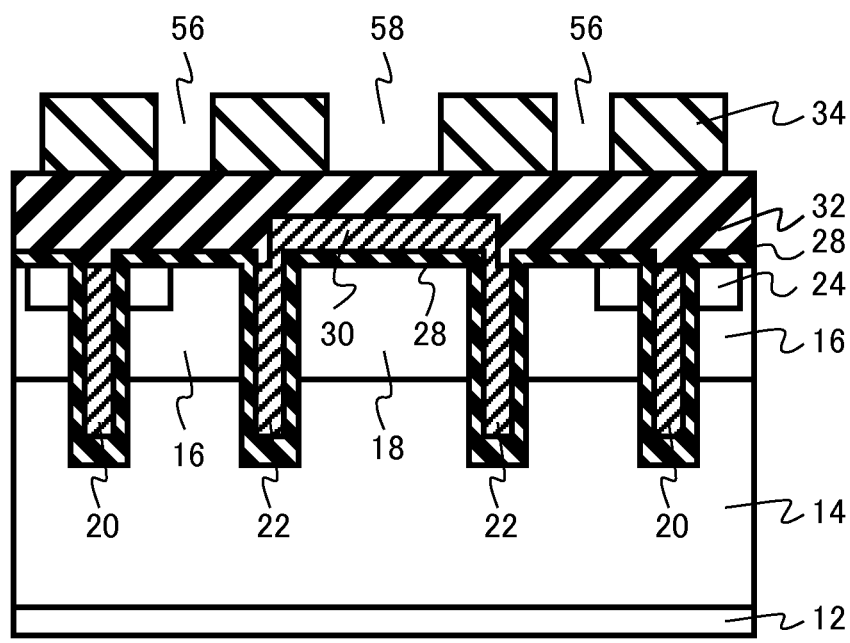
FIG. 16 is a cross-sectional view schematically illustrating the semiconductor device which is being manufactured in the semiconductor device manufacturing method according to the fourth embodiment.
Figure 17:
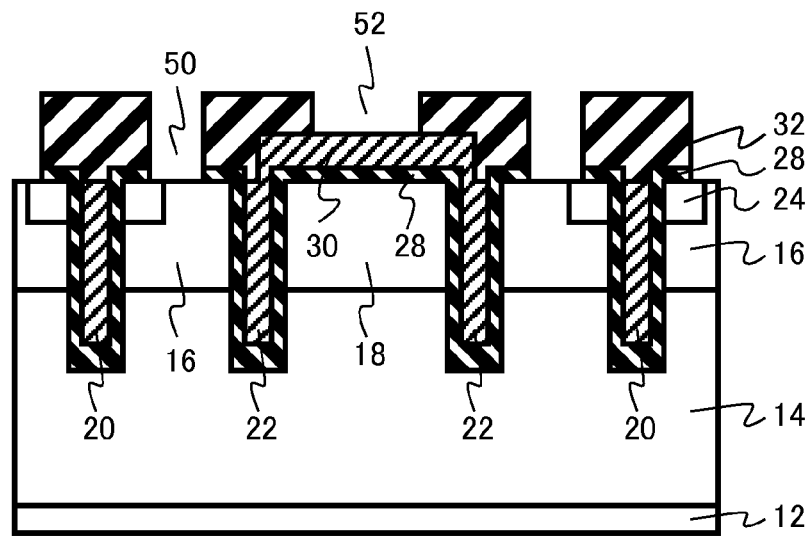
FIG. 17 is a cross-sectional view schematically illustrating the semiconductor device which is being manufactured in the semiconductor device manufacturing method according to the fourth embodiment.

Next, an example of a method for manufacturing the semiconductor device according to this embodiment will be described. FIGS. 15, 16, and 17 are cross-sectional views schematically illustrating the method for manufacturing the semiconductor device according to this embodiment.

A Si wafer which has a desired resistivity for an n$^-$ base layer 14 is used. The p-type base layer 16, a p-type floating layer 18, a gate electrode 20, a dummy gate electrode 22, the n$^+$ emitter layer (semiconductor layer) 24, an insulating film (first insulating film) 28, a dummy gate wiring layer (first conductive layer) 30, and the interlayer insulating film (second insulating film) 32 are formed by a known process technique. This process is the same as that in the manufacturing method according to the first embodiment.

Then, the surface of the interlayer insulating film 32 is planarized by, for example, a chemical mechanical polishing (CMP) method (FIG. 15).

Then, a photoresist 34 is patterned by a lithography method (FIG. 16). A first pattern 56 for forming the first contact portion and a second pattern 58 for forming the second contact portion are simultaneously formed by this patterning process.

Then, etching is performed using the photoresist 34 as a mask to form the first contact portion 50 and the second contact portion 52. The etching is performed by, for example, an RIE method. Then, the photoresist 34 is removed (FIG. 17).

Then, a contact plug 54, a sidewall 60, an emitter electrode 26, and a collector electrode 10 are formed by the same method as that in the second embodiment. In this way, the IGBT 400 illustrated in FIG. 14 is manufactured.

According to this embodiment, similarly to the second embodiment, since the sidewall 60 is provided, the degradation of the reliability of the IGBT 400 is reduced.

(Fifth Embodiment)

A semiconductor device according to this embodiment differs from the semiconductor device according to the fourth embodiment in that it includes a second conductive layer and a third conductive layer which are physically independent. Hereinafter, the description of the same components as those in the fourth embodiment will not be repeated.

Figure 18:
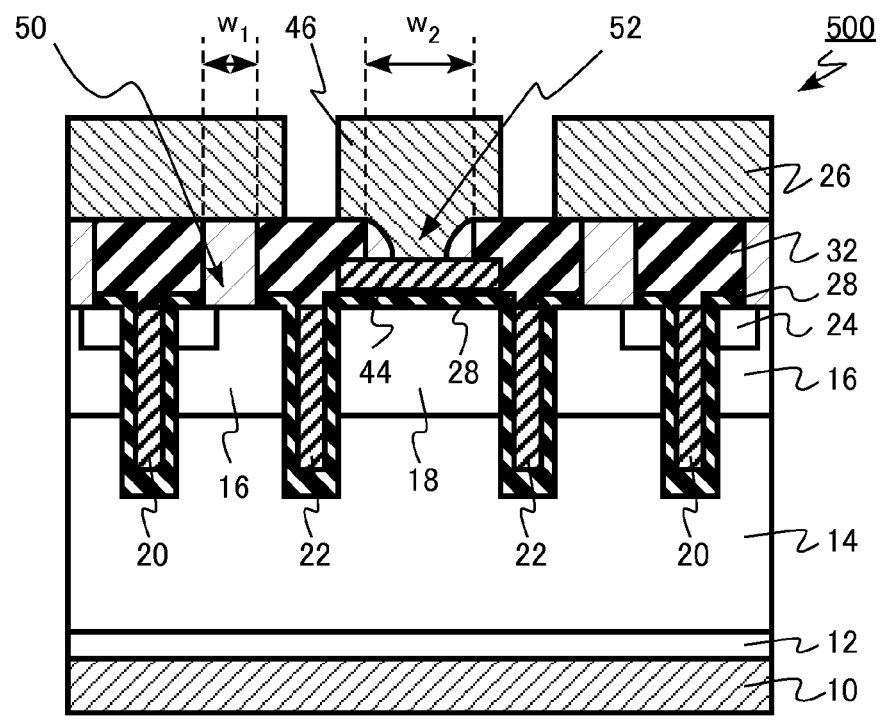
FIG. 18 is a diagram schematically illustrating a main portion of a semiconductor device according to a fifth embodiment.

FIG. 18 is a diagram schematically illustrating a main portion of the semiconductor device according to this embodiment.

An IGBT 500 according to this embodiment includes a gate wiring layer (first conductive layer) 44, instead of the dummy gate wiring layer 30 according to the fourth embodiment. In addition, the IGBT 500 includes an emitter electrode (second conductive layer) 26 and a gate wiring electrode (third conductive layer) 46 which are provided on an interlayer insulating film (second insulating film) 32.

A first contact portion 50 is provided in order to connect a p-type base layer (semiconductor layer) 16 and an $n^+$ emitter layer (semiconductor layer) 24 to the emitter electrode (second conductive layer) 26. A second contact portion 52 is provided in order to connect the gate wiring layer (first conductive layer) 44 to a gate wiring electrode (third conductive layer) 46. The gate wiring layer 44 is physically and electrically independent of a dummy gate electrode 22. For example, the same potential as that of a gate electrode 20 is applied to the gate wiring layer 44.

According to this embodiment, similarly to the second embodiment, since a sidewall 60 is provided, the degradation of the reliability of the IGBT 500 is reduced.

In this embodiment, the gate wiring layer 44 is provided in a cell in which a trench is formed. However, this embodiment can also be applied to a gate wiring layer which is provided in the periphery of a chip and is connected to a bonding pad. In this case, a contact of a gate line may be a plurality of contacts with a rectangular shape, a contact with an uneven shape, or a contact with a wavy shape, as the second contacts illustrated in FIGS. 10 to 12.

In the first to fifth embodiments, the IGBT is given as an example of the semiconductor device. However, the invention can also be applied to other semiconductor devices such as MOSFETs.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer;
   a first insulating film provided on the semiconductor layer;
   a first conductive layer provided on the first insulating film, the first conductive layer extending in a first direction;
   a second insulating film provided on the semiconductor layer and the first conductive layer;
   a second conductive layer provided on the second insulating film;
   a first contact portion connecting the semiconductor layer and the second conductive layer;
   at least one second contact portion connecting the first conductive layer and the second conductive layer, a length of the at least one second contact portion in the first direction is larger than a width of the at least one second contact portion in a second direction perpendicular to the first direction, the width of the at least one second contact portion being larger than a width of the first contact portion in the second direction;
   a contact plug provided at the first contact portion and made of a material different from a material forming the second conductive layer; and
   a sidewall provided at the at least one second contact portion and made of the same material as the contact plug, the sidewall extending in the first direction,
   wherein a distance between the semiconductor layer and an upper portion of the second insulating film adjacent to the at least one second contact portion is greater than a distance between the semiconductor layer and an upper portion of the second insulating film adjacent to the first contact portion, and
   the second conductive layer directly contacts the first conductive layer.

2. The device according to claim 1,
   wherein the first conductive layer includes polycrystalline silicon,
   the contact plug includes tungsten (W), and
   the second conductive layer includes aluminum (Al).

3. The device according to claim 1,
   wherein the at least one second contact portion includes a plurality of second contact portions, and the second contact portions are provided so as to be adjacent to each other.

4. The device according to claim 1,
   wherein an edge of the at least one second contact portion has an uneven shape in a plane parallel to a surface of the semiconductor layer.

5. The device according to claim 1,
   wherein an edge of the at least one second contact portion has a wavy shape in a plane parallel to a surface of the semiconductor layer.

6. A semiconductor device comprising:
   a semiconductor layer;
   a first insulating film provided on the semiconductor layer;

a first conductive layer provided on the first insulating film, the first conductive layer extending in a first direction;
a second insulating film provided on the semiconductor layer;
a third insulating film provided on the first conductive layer;
a second conductive layer provided on the second insulating film;
a third conductive layer provided on the third insulating film;
a first contact portion connecting the semiconductor layer and the second conductive layer;
at least one second contact portion connecting the first conductive layer and the third conductive layer, a length of the at least one second contact portion in the first direction is larger than a width of the at least one second contact portion in a second direction perpendicular to the first direction, the width of the at least one second contact portion being larger than a width of the first contact portion in the second direction;
a contact plug provided at the first contact portion and made of a material different from materials forming the second conductive layer and the third conductive layer; and
a sidewall provided at the at least one second contact portion and made of the same material as the contact plug, the sidewall extending in the first direction,
wherein the third conductive layer directly contacts the first conductive layer.

7. The device according to claim 6,
wherein the first conductive layer includes polycrystalline silicon,
the contact plug includes tungsten (W), and
the second conductive layer and the third conductive layer include aluminum (Al).

8. The device according to claim 6,
wherein the at least one second contact portion includes a plurality of second contact portions, the second contact portions are provided so as to be adjacent to each other.

9. The device according to claim 6,
wherein an edge of the at least one second contact portion has an uneven shape in a plane parallel to a surface of the semiconductor layer.

10. The device according to claim 6,
wherein an edge of the at least one second contact portion has a wavy shape in a plane parallel to a surface of the semiconductor layer.

11. The device according to claim 6,
wherein a distance between the semiconductor layer and an upper portion of the third insulating film adjacent to the at least one second contact portion is greater than a distance between the semiconductor layer and an upper portion of the second insulating film adjacent to the first contact portion.

12. A semiconductor device comprising:
a semiconductor layer;
a first insulating film provided on the semiconductor layer;
a first conductive layer provided on the first insulating film, the first conductive layer extending in a first direction;
a second insulating film provided on the semiconductor layer and the first conductive layer, the second insulating film having a first opening and a second opening, a length of the second opening in the first direction is larger than a width of the second opening in a second direction perpendicular to the first direction, the width of the second opening being larger than a width of the first opening in the second direction;
a second conductive layer provided on the second insulating film;
a first conducting member provided in the first opening, the first conducting member connecting the semiconductor layer and the second conductive layer;
a second conducting member provided in the second opening, the second conducting member connecting the first conductive layer and the second conductive layer; and
a sidewall provided at the second opening, the sidewall being made of the same material as the first conducting member, the sidewall extending in the first direction,
wherein a distance between the semiconductor layer and an upper portion of the second insulating film adjacent to the second opening is greater than a distance between the semiconductor layer and an upper portion of the second insulating film adjacent to the first opening,
the first conducting member is made of different material from the second conductive member, and
the second conducting member directly contacts the first conductive layer.

* * * * *